United States Patent
Miyajima et al.

(10) Patent No.: US 7,796,867 B2
(45) Date of Patent: Sep. 14, 2010

(54) MOTOR DRIVE DEVICE AND COOLING DEVICE USING THE SAME

(75) Inventors: Satoshi Miyajima, Kyoto (JP); Hiroaki Hayashi, Kyoto (JP); Tomofumi Mishima, Kyoto (JP)

(73) Assignee: Rohm Co., Ltd. (JP)

( * ) Notice: Subject to any disclaimer, the term of this patent is extended or adjusted under 35 U.S.C. 154(b) by 264 days.

(21) Appl. No.: 12/064,389

(22) PCT Filed: Aug. 23, 2006

(86) PCT No.: PCT/JP2006/316468

§ 371 (c)(1),
(2), (4) Date: Feb. 21, 2008

(87) PCT Pub. No.: WO2007/023839

PCT Pub. Date: Mar. 1, 2007

(65) Prior Publication Data

US 2009/0096402 A1    Apr. 16, 2009

(30) Foreign Application Priority Data

Aug. 26, 2005   (JP) .............................. 2005-246103

(51) Int. Cl.
*H02P 7/29* (2006.01)
(52) U.S. Cl. .................. 388/811; 388/815; 318/811
(58) Field of Classification Search ................. 388/811, 388/815; 318/811

See application file for complete search history.

(56) References Cited

U.S. PATENT DOCUMENTS 6,040,668 A * 3/2000 Huynh et al. ................ 318/471

FOREIGN PATENT DOCUMENTS

JP           3-89893          4/1991

(Continued)

OTHER PUBLICATIONS

International Search Report for International Application No. PCT/JP2006/316468 mailed Nov. 7, 2006.

(Continued)

*Primary Examiner*—Walter Benson
*Assistant Examiner*—Erick Glass
(74) *Attorney, Agent, or Firm*—Cantor Colburn LLP (57) ABSTRACT

A drive circuit of a fan motor is provided. In an embodiment of the drive circuit, a first PWM comparator compares a temperature detection voltage with a cyclic voltage, and outputs a first PWM signal. A second PWM comparator compares a minimum frequency setting voltage indicating a minimum frequency of the fan motor, with the cyclic voltage, and outputs a second PWM signal. The drive circuit combines the first PWM signal and the second PWM signal by a logical operation, to drive the fan motor. The drive circuit includes a first logic gate which generates a logical sum of the first PWM signal and the second PWM signal, and a second logic gate which generates a logical product of the first PWM signal and an inverted signal of the second PWM signal. The drive circuit switches drive mode based on the first logic gate and the second logic gate.

11 Claims, 7 Drawing Sheets

| FOREIGN PATENT DOCUMENTS | | |
|---|---|---|
| JP | 7-31190 | 1/1995 |
| JP | 11-4975 | 1/1999 |
| JP | 2001-284868 | 10/2001 |
| JP | 2003-309959 | 10/2003 |
| JP | 2004-153955 | 5/2004 |

OTHER PUBLICATIONS

International Preliminary Report on Patentability for International Application No. PCT/JP2006/316468 mailed Nov. 7, 2006 with English Translation.

* cited by examiner

FIG.3A  Vth, Vmin, Vosc
FIG.3B  Vpwm1
FIG.3C  Vpwm2
FIG.3D  Sig1
FIG.3E  Sig2

MOTOR DRIVE DEVICE AND COOLING DEVICE USING THE SAME

CROSS REFERENCE TO RELATED APPLICATIONS

This is a U.S. national stage of application No. PCT/JP2006/316468, filed on 23 Aug. 2006. Priority under 35 U.S.C. §119(a) and 35U.S.C. §365(b) is claimed from Japanese Application No. 2005-246103, filed 26 Aug. 2005, the disclosure of which is also incorporated herein by reference.

BACKGROUND OF THE INVENTION

1. Field of the Invention

The present invention relates to motor drive technology.

2. Description of the Related Art

In recent years, with the speeding up of personal computers and workstations, operating speeds of LSIs (Large Scale Integrated circuits) for processing in CPUs (Central Processor Units), DSPs (Digital Signal Processors), and the like, have been increasing.

In such LSIs, as the operating speeds, that is, clock frequencies, become higher, amounts of heat generated become large. There is a problem in that the generated heat from an LSI leads to thermorunaway in the LSI itself, or has an impact on neighboring circuits. Therefore, appropriate heat cooling of the LSIs has become a very important technology.

As an example of technology for cooling the LSI, there is a cooling method comprising an air-cooling system by a cooling fan. In this method, for example, the cooling fan is installed facing a surface of the LSI, and cool air is blown on the LSI surface by the cooling fan. When the LSI is cooled by this type of cooling fan, temperature in the vicinity of the LSI is monitored, and cooling level is adjusted by changing rotation of the fan in accordance with the temperature (Patent Documents 1 and 2). Furthermore, Patent Document 3 discloses technology in which a duty ratio of a pulse-width modulated signal is limited, so that a fan motor rotates at or above a predetermined minimum frequency.

Patent Document 1: Japanese Patent Application Laid Open No. H07-31190

Patent Document 2: Japanese Patent Application Laid Open No. 2001-284868

Patent Document 3: Japanese Patent Application Laid Open No. 2004-153955

In the technology described in Patent Document 3, by using a three-input comparator to compare voltage (referred to below as temperature detection voltage) that depends on temperature generated using a thermistor, and voltage (referred to below as minimum frequency setting voltage) that prescribes a minimum frequency, with a cyclic voltage of a sawtooth waveform, a pulse-width modulation signal, whose duty ratio is limited, is generated.

However, in cases in which the three-input comparator is used, as the temperature detection voltage approaches the minimum frequency setting voltage, influence of an input offset voltage of the three-input comparator becomes significant. As a result, at a low temperature at which motor frequency drops, there has been a problem in that accuracy, that is, linearity, of rotation control of a fan motor deteriorates.

SUMMARY OF THE INVENTION

The present invention was made in view of these issues, and one general purpose thereof is to provide a motor drive apparatus that improves linearity.

In an embodiment of the present invention a motor drive apparatus is provided with a first pulse width modulation comparator which compares a temperature detection voltage that depends on temperature, with a cyclic voltage, and outputs a first pulse width modulation signal; a second pulse width modulation comparator which compares a minimum frequency setting voltage indicating a minimum frequency of a motor that is to be driven, with the cyclic voltage, and outputs a second pulse width modulation signal; and a drive circuit which combines the first and the second pulse width modulation signals outputted from the first and the second pulse width modulation comparators, by a logical operation, to drive the motor that is to be driven.

According to this embodiment, by providing the first and the second pulse width modulation comparators and combining the two pulse width modulation signals by a logical operation, in comparison to cases in which a three-input comparator is used, it is possible to reduce an effect of an input offset voltage, and to improve linearity of a temperature-frequency characteristic.

The drive circuit may include a first logic gate which generates a logical sum of the first and the second pulse width modulation signals; a second logic gate which generates a logical product of either of the first or the second pulse width modulation signals, and an inverted signal of the other thereof; and a selector which switches between a first drive mode based on an output signal of the first logic gate, and a second drive mode based on an output signal of the second logic gate.

In the first logic gate, a signal whose duty ratio is limited by the second pulse width modulation signal is generated, and in the second logic gate, a difference signal between the first pulse width modulation signal and the second pulse width modulation signal is generated. By switching the two output signals outputted from these two logic gates, to drive the motor, motor driving with a high degree of freedom can be realized.

The abovementioned motor drive apparatus may be further provided with an amplifier which amplifies the temperature detection voltage, and the first pulse width modulation comparator may generate a first pulse width modulation signal by comparing an output signal of the amplifier with the cyclic voltage. The amplifier may be configured such that gain therein is adjustable by an external resistance.

By amplifying the temperature detection voltage, it is possible to generate the first pulse width modulation signal using a preferable range of linearity of temperature dependency of temperature detection voltage, and it is possible to improve temperature-frequency linearity.

The abovementioned motor drive apparatus may be further provided with a smoothing circuit which smoothes a pulse width modulated control signal that controls the frequency of the motor that is to be driven, and outputs the pulse width modulated control signal as a rotation control voltage. The second pulse width modulation comparator may compare the rotation control voltage instead of the minimum frequency setting voltage, with the cyclic voltage, and output the second pulse width modulation signal.

In such cases, it is possible to change the motor in accordance not only with temperature, but also with duty ratio of the control signal.

The smoothing circuit may include a first transistor in which the control signal is inputted to a base and which has a grounded emitter; a first resistor, one end of which is connected to a collector of the first transistor, and a predetermined voltage being applied to the other end; a second transistor whose base is connected to a connection point of the first transistor and the first resistor, and whose emitter is grounded; a second resistor, one end of which is connected to a collector of the second transistor, and the predetermined voltage being applied to the other end; and a capacitor connected between the collector of the second transistor and ground. A signal occurring at the collector of the second transistor may be outputted as the rotation control voltage.

The motor drive apparatus may be integrated as a unit on one semiconductor substrate. "Integrated as a unit" includes cases in which all circuit component elements are formed on the semiconductor substrate, and cases in which main component elements of the circuit are integrated as a unit and some resistors, capacitors, and the like, for adjusting a circuit constant, may be arranged outside the semiconductor substrate. By integrating the motor drive apparatus on one LSI, it is possible to reduce circuit area.

Another embodiment of the present invention is a cooling device. This device is provided with a fan motor and the abovementioned motor drive apparatus, which drives the fan motor. According to this embodiment, it is possible to control the frequency of the fan motor in accordance with temperature, with good accuracy.

A further embodiment of the invention is an electronic device. The electronic device is provided with the abovementioned cooling device. According to this embodiment, it is possible to preferably control an object to be cooled, inside the electronic device, in accordance with temperature.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

An embodiment of the present invention relates to a motor drive apparatus used in a cooling device for cooling an electronic computer such as a desktop or notebook type of personal computer or workstation, or an electronic device such as a refrigerator, or the like.

Figure 1:
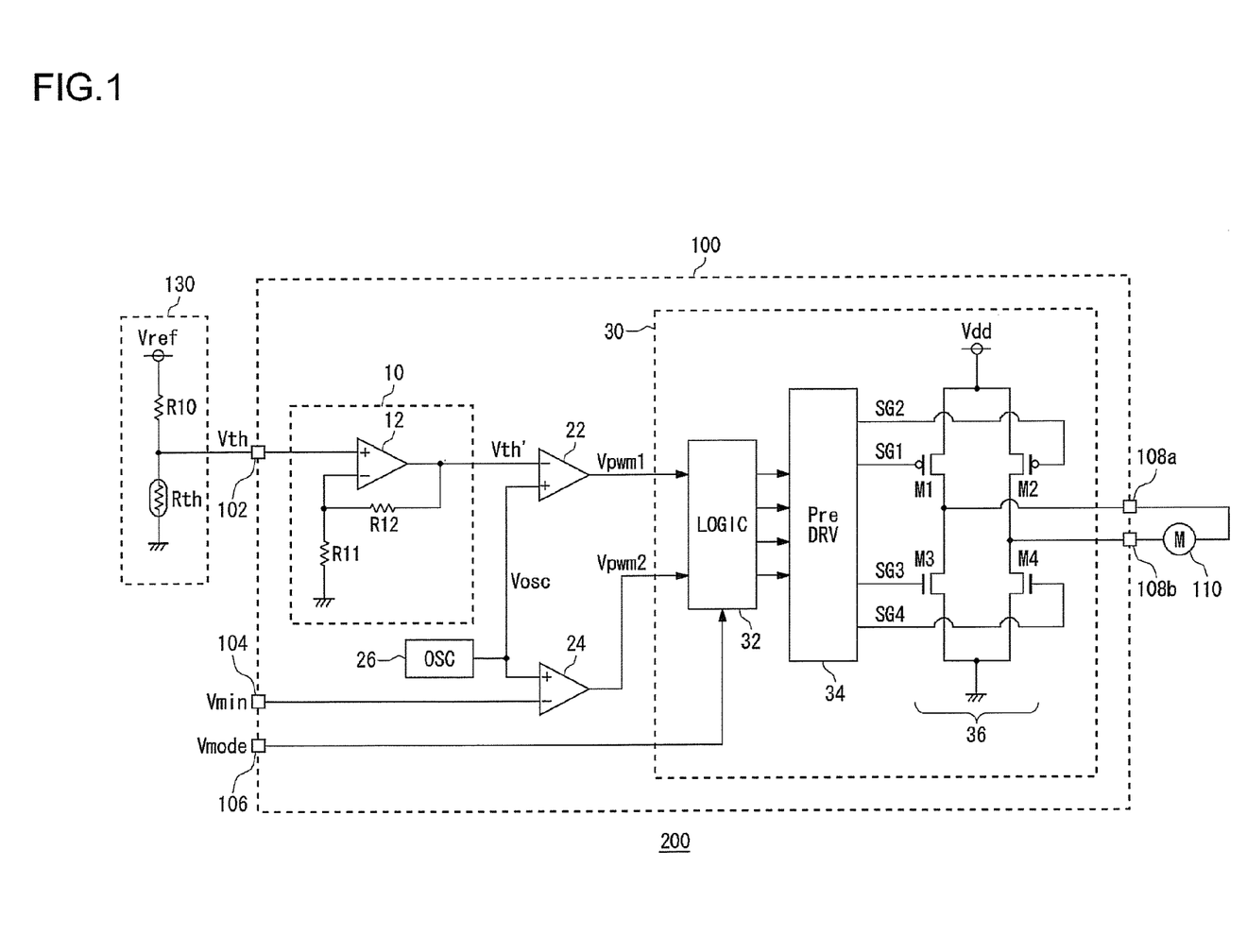
FIG. 1 is a circuit diagram showing a configuration of a cooling device according to a first embodiment of the present invention.

FIG. 1 is a circuit diagram showing a configuration of a cooling device 200 according to a first embodiment of the invention. The cooling device 200 includes a motor drive apparatus 100 and a fan motor 110.

The fan motor 110 is a single-phase full-wave motor, and is disposed opposite an object that is to be cooled, which is not shown in the figure. In the fan motor 110, a coil current, that is, an energization state (conduction state), is controlled by a drive signal outputted from the motor drive apparatus 100, and rotation is controlled.

The motor drive apparatus 100 is a function IC integrated as a unit on one semiconductor substrate. As terminals for input and output of signals, the motor drive apparatus 100 is provided with a temperature detection terminal 102, a minimum frequency setting terminal 104, a mode selection terminal 106, and output terminals 108a and 108b.

A temperature detection circuit 130 that generates a temperature detection voltage Vth dependent on the ambient temperature of an object to be cooled, is connected to the temperature detection terminal 102. The temperature detection circuit 130 includes a thermistor Rth and a resistor R1 connected in series between a reference voltage Vref and ground. Voltage at a connection point of the thermistor Rth and the resistor R10 is outputted to the temperature detection terminal 102 of the motor drive apparatus 100, as a temperature detection voltage Vth. The voltage value of the temperature detection voltage Vth decreases as the ambient temperature increases.

A minimum frequency setting voltage Vmin indicating a minimum frequency of the fan motor 110 that is to be driven, is inputted to the minimum frequency setting terminal 104.

The motor drive apparatus 100 according to the present embodiment switches the fan motor 110 between two drive modes, described later, based on the temperature detection voltage Vth and the minimum frequency setting voltage Vmin, inputted to respective terminals, and drives the fan motor 110. A mode selection signal Vmode for switching between the two drive modes is inputted to a mode selection terminal 106.

Below, a detailed explanation will be given concerning an internal configuration of the motor drive apparatus 100. The motor drive apparatus 100 is provided with an amplifier 10, a first pulse width modulation comparator 22 (referred to below as a first PWM comparator), a second pulse width modulation comparator 24 (referred to below as a second PWM comparator), an oscillator 26, and a drive circuit 30.

The amplifier 10 amplifies the temperature detection voltage Vth that is dependent on temperature, outputted from the temperature detection circuit 130. The amplifier 10 includes an operational amplifier 12, and resistors R11 and R12. The temperature detection voltage Vth is inputted to a non-inverse input terminal of the operational amplifier 12; the resistor R11 is arranged between the inverse input terminal and ground, and the resistor R12 is arranged between the inverse input terminal and an output terminal. The amplifier 10 amplifies the temperature detection voltage Vth by a gain of $(1+R12/R11)$, and outputs the result to the first PWM comparator 22 of a later stage. At least one of the resistors R11 and R12 may be arranged as an external member externally connected to the motor drive apparatus 100. In such cases, it is possible to adjust the gain of the amplifier 10. Below, an amplified signal outputted from the amplifier 10 is taken as a temperature detection voltage Vth'.

An oscillator 26 outputs the cyclic voltage Vosc that has a voltage waveform of a triangular waveform or a sawtooth waveform, at a constant frequency. The first PWM comparator 22 compares the temperature detection voltage Vth outputted from the amplifier 10, with the cyclic voltage Vosc, and outputs the first PWM signal Vpwm1 at a high level when Vth'<Vosc, and at a low level when Vth'>Vosc. A duty ratio of this first PWM signal Vpwm1 becomes large, according as temperature monitored by the temperature detection circuit 130 increases.

A second PWM comparator 24 compares the minimum frequency setting voltage Vmin indicating the minimum frequency of the fan motor 110 that is to be driven, with the cyclic voltage Vosc outputted from the oscillator 26. The second PWM signal Vpwm2 outputted from the second PWM comparator 24 has a high level when Vmin<Vosc, and has a low level when Vmin>Vosc.

The first PWM signal Vpwm1 outputted from the first PWM comparator 22, together with the second PWM signal Vpwm2 outputted from the second PWM comparator 24 are outputted to the drive circuit 30 of a later stage. The drive circuit 30 includes a logic circuit 32, a pre-driver circuit 34, and an H-bridge circuit 36. The logic circuit 32 combines the first PWM signal Vpwm1 and the second PWM signal Vpwm2 by a logical operation. The pre-driver circuit 34 controls turning ON and OFF a first high side switch M1, a second high side switch M2, a first low side switch M3, and a second low side switch M4, that make up the H-bridge circuit 36, based on a signal synthesized by the logic circuit 32, to drive the fan motor 110.

Figure 2:
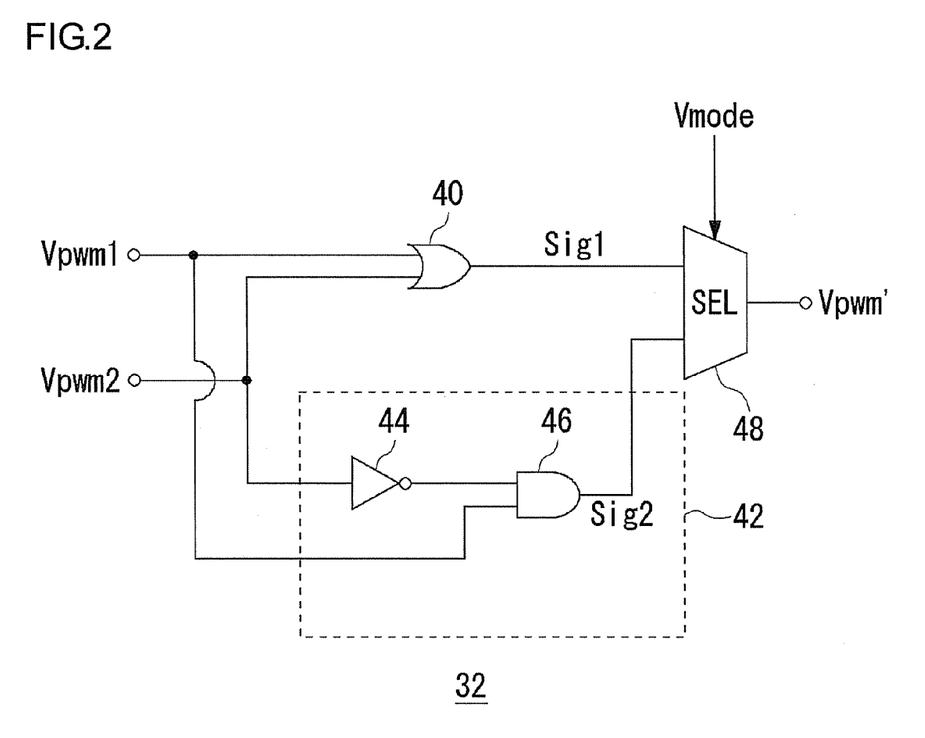
FIG. 2 is a circuit diagram showing part of a configuration of a logic circuit of FIG. 1.

FIG. 2 is a circuit diagram showing part of a configuration of the logic circuit 32. The logic circuit 32 includes a first logic gate 40, a second logic gate 42, and a selector 48.

The first logic gate 40 is an OR gate and generates a logical sum of the first PWM signal Vpwm1 and the second PWM signal Vpwm2. An output signal of the first logic gate 40 is taken as a first signal Sig1. That is, a relationship Sig1=Vpwm1 ∨ Vpwm2 is established.

The second logic gate 42 includes an inverter 44 and an AND gate 46. The inverter 44 inverts the second PWM signal Vpwm2. The AND gate 46 generates a logical product of the inverted second PWM signal Vpwm2 and the first PWM signal Vpwm1. An output signal of the AND gate 46 is taken as a second signal Sig2. That is, a relationship, Sig2=Vpwm1 ∧(*Vpwm2) is established. Here, * represents logical inverse.

The selector 48 selects and outputs one of the first signal Sig1 outputted from the first logic gate 40 and the second signal Sig2 outputted from the second logic gate 42, based on a mode selection signal Vmode inputted to the mode selection terminal 106 of FIG. 1. The drive circuit 30 drives the fan motor 110, based on a signal Vpwm' outputted from the selector 48. In the present embodiment, motor driving based on an output signal of the first logic gate 40 is referred to as a first drive mode, and motor driving based on an output signal of the second logic gate 42 is referred to as a second drive mode.

The explanation returns to FIG. 1. The H-bridge circuit 36, which is an output stage of the drive circuit 30, includes the first high side switch M1, the second high side switch M2, the first low side switch M3, and the second low side switch M4.

The first high side switch M1 and the second high side switch M2 are P-channel MOSFETs (Metal Oxide Semiconductor Field Effect Transistors), and the first low side switch M3 and the second low side switch M4 are N-channel MOSFETs.

The first high side switch M1 and the first low side switch M3 are connected in series between ground and a power supply line to which a power supply voltage Vdd is applied. Voltage at a connection point of the first high side switch M1 and the first low side switch M3 is applied, via an output terminal 108, to one end of the fan motor 110, as a drive voltage. The first high side switch M1 and the first low side switch M3 are controlled by a gate control signal inputted to each gate. ON and OFF states of the first high side switch M1 and the first low side switch M3 are complementarily controlled.

A voltage outputted from the output terminal 108a and applied to one end of the fan motor 110 becomes the power supply voltage Vdd when the first high side switch M1 is ON and the first low side switch M3 is OFF, and becomes ground potential 0V when the first high side switch M1 is OFF and the first low side switch M3 is ON.

In the same way, the second high side switch M2 and the second low side switch M4 are connected in series between the power supply line and ground. Voltage at a connection point of the second high side switch M2 and the second low side switch M4 is applied, via the output terminal 108b, to the other end of the fan motor 110.

Figure 3A:
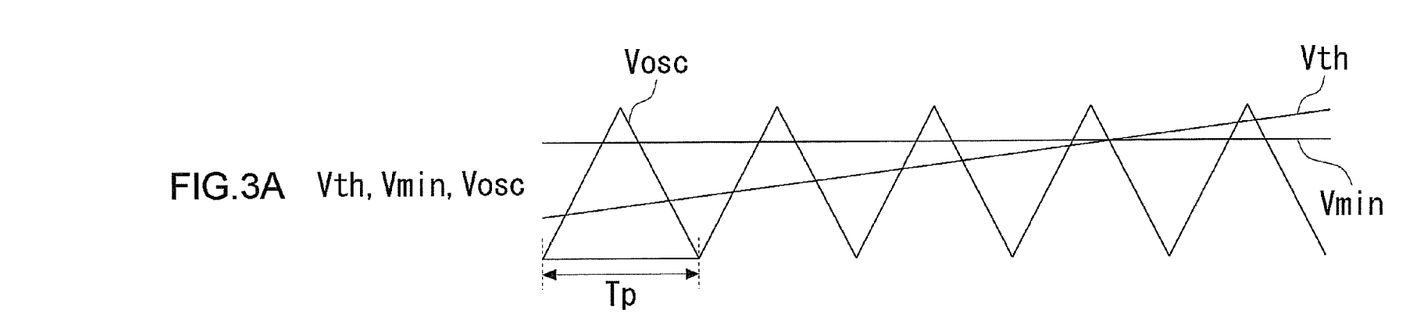
FIGS. 3A to 3E are time charts showing operation states of the cooling device of FIG. 1.
Figure 3B:
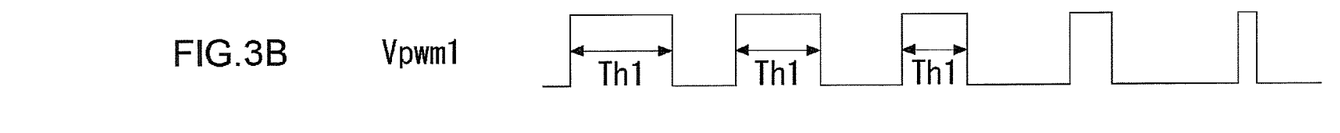
Figure 3C:
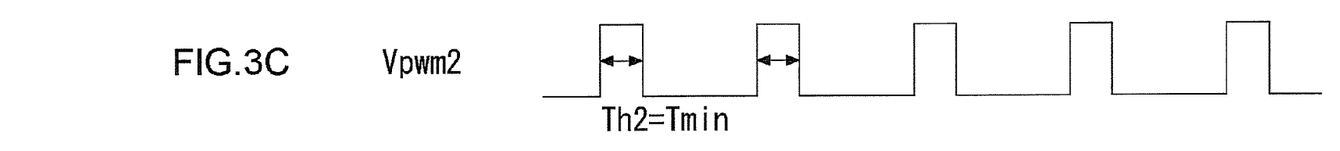
Figure 3D:
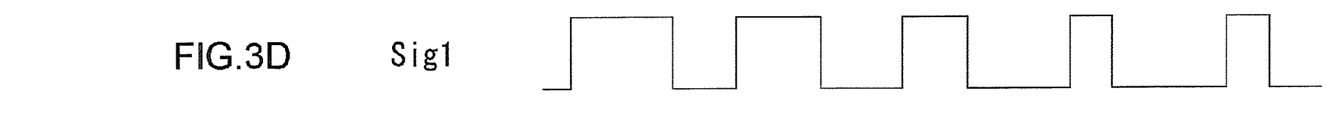
Figure 3E:
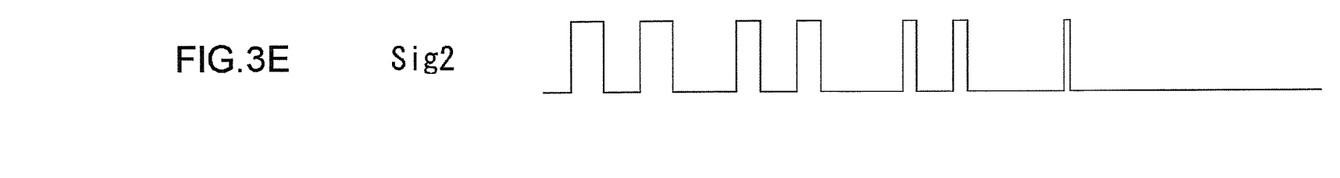

An explanation will be given concerning operation of the cooling device 200 configured as above, based on FIGS. 3A-3E. FIG. 3A to 3E are time charts showing operation states of the cooling device 200 of FIG. 1. FIG. 3A shows the temperature detection voltage Vth, the minimum frequency setting voltage Vmin, and the cyclic Vosc, FIG. 3B shows the first PWM signal Vpwm1, FIG. 3C shows the second PWM signal Vpwm2, FIG. 3D shows the first signal Sig1, and FIG. 3E shows the second signal Sig2.

When the temperature that is to be cooled decreases, and resistance value of the thermistor Rth rises, the temperature detection voltage Vth outputted from the temperature detection circuit 130 rises. At this time, a time-period Th1, in which the first PWM signal Vpwm1 outputted from the first PWM comparator 22 has a high level, becomes shorter in accordance with the temperature decreasing, as shown in FIG. 3B.

On the other hand, a time-period Th2, in which the second PWM signal Vpwm2 outputted from the second PWM comparator 24 has a high level, does not change with the temperature, but is fixed at a minimum value Tmin determined by the minimum frequency setting voltage Vmin.

In the logic circuit 32, the first signal Sig1 generated by the first logic gate 40 is given by a logical sum of the first PWM signal Vpwm1 and the second PWM signal Vpwm2. Therefore, the time-period, in which the first signal Sig1 has a high level, gradually becomes shorter in accordance with the temperature decreasing, with the minimum value Tmin, determined by the minimum frequency setting voltage Vmin, as a lower limit.

The high level of the second signal Sig2 is given by a logical product of the first PWM signal Vpwm1 and an inverted signal of the second PWM signal Vpwm2, by the second logic gate 42. Therefore, the second signal Sig2 has a high level in only a time-period of: the time-period Th1 in which the first PWM signal Vpwm1 has a high level, less the time-period Th2 in which the second PWM signal Vpwm2 has a high level.

Figure 4:
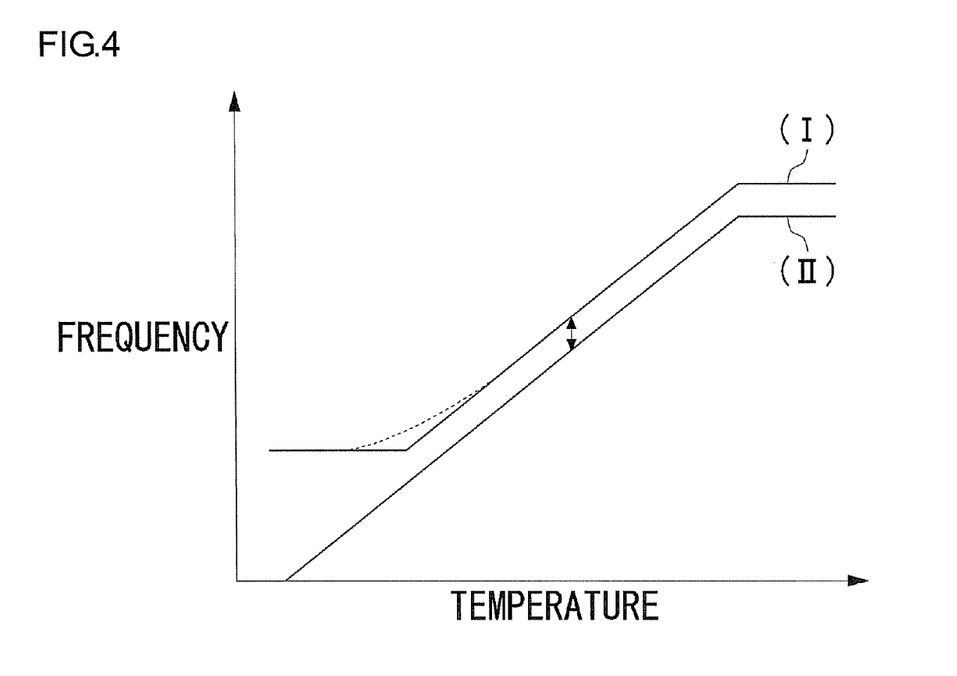
FIG. 4 shows a relationship of frequency of a fan motor and temperature in a first drive mode and a second drive mode.

As described above, the drive circuit 30 drives the fan motor 110 based on the first signal Sig1 in the first drive mode, and based on a second signal Sig2 in the second drive mode. FIG. 4 shows a relationship of the frequency of the fan motor 110 and temperature in the first drive mode and the second drive mode.

In FIG. 4, (I) indicates a characteristic of the first drive mode. In the first drive mode, when the temperature is low, since the time-period in which the first signal Sig1 has a high level is a minimum value Tmin, the fan motor 110 rotates at a minimum frequency. As the temperature rises, the time-period in which the first signal Sig1 has a high level becomes long, and the frequency of the fan motor 110 increases linearly. When the temperature rises and a duty ratio of the first signal Sig1 becomes 100%, the fan motor 110 is driven at full torque, and rotates at maximum frequency.

A characteristic of the first drive mode is focused upon. As shown by a broken line in FIG. 4, in cases in which a three-input comparator is used, close to the minimum frequency, linearity of the relationship between the temperature and frequency deteriorates. In response to this, in the motor drive apparatus 100 according to the present embodiment, since pulse width modulation is performed, using two comparators and not using a three-input comparator, on the temperature detection voltage Vth and the minimum frequency setting voltage Vmin, comparator input offset voltage effects are not easily received. As a result, as shown by the full line (I) in FIG. 4, close to the minimum frequency, it is possible to drive the fan motor 110 without deteriorating linearity.

Next, a characteristic of the second drive mode is focused upon. In the second drive mode, the time-period in which the second signal Sig2 has a high level gradually becomes shorter in accordance with the temperature becoming lower, without the minimum value Tmin being limited, and eventually becomes 0. As a result, when the temperature is low, the frequency of the fan motor 110 approaches 0. The time-period in which the second signal Sig2 is high is shorter by the minimum value Tmin in comparison to the time-period in which the first signal Sig1 has a high level. Therefore, the frequency of the fan motor 110 in the second drive mode is shifted by Δrpm with respect to the frequency in the first drive mode. When the temperature rises, the time-period Th1 in which the first PWM signal Vpwm1 has a high level becomes equal to a cycle time Tp of the cyclic voltage Vosc, and the duty ratio becomes 100%. At this time, the time-period in which the second signal Sig2 has a high level becomes (Tp−Tmin), and the frequency of the fan motor 110 is limited.

As described above, according to the motor drive apparatus 100 according to the present embodiment, by switching the first drive mode and the second drive mode, it is also possible to preferably switch a control method of the fan motor 110, in accordance with the state of the object to be cooled.

Furthermore, in the motor drive apparatus 100 according to the present embodiment, it is possible to obtain the following effects by a configuration such that the gain of the amplifier 10 can be varied by an external resistance.

Figure 5A:
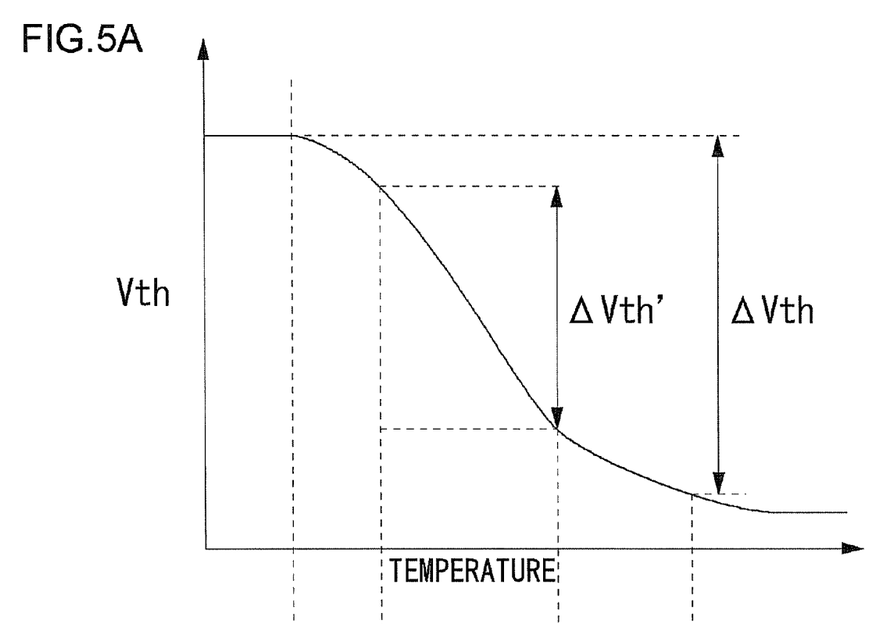
FIGS. 5A and 5B show relationships of a characteristic of a general temperature detection circuit that uses a thermistor, and motor frequency, with temperature.

FIG. 5A shows a relationship of the temperature detection voltage Vth with temperature in cases in which the temperature detection circuit 130 is configured using a thermistor. As shown in FIG. 5A, in cases in which the relationship of the temperature with the temperature detection voltage Vth does not form a straight line, the relationship of temperature with the frequency of the fan motor 110 does not form a straight line as shown in FIG. 4, and linearity deteriorates as shown by a full line in FIG. 5B.

Figure 5B:
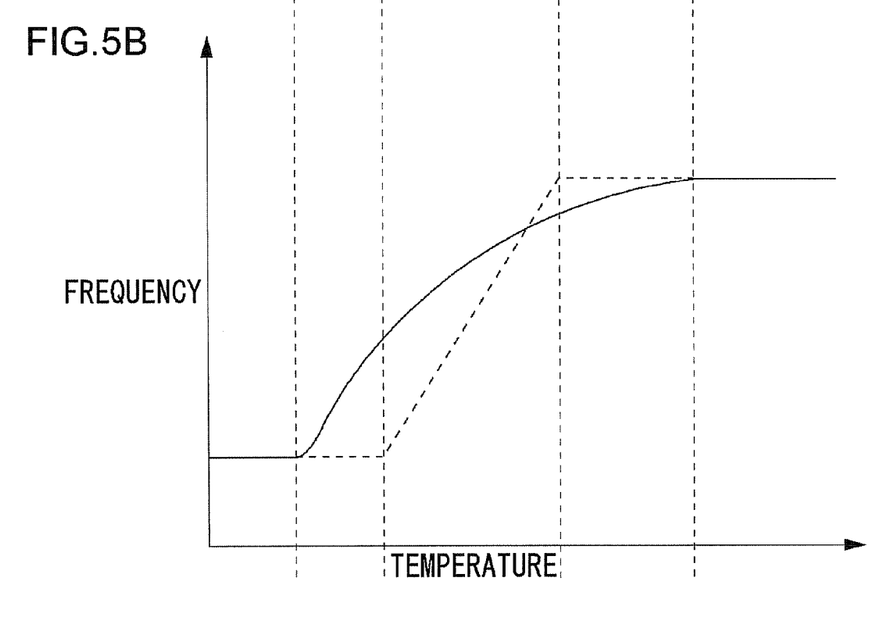

In such cases, by enlarging the gain of the amplifier 10, it is possible to obtain a relationship of frequency and temperature that has excellent linearity as shown by the broken line in FIG. 5B. That is, in cases in which the gain of the amplifier 10 is low, the first PWM signal Vpwm1 is generated in a voltage range shown by ΔVth in FIG. 5A. In response to this, in cases in which the gain of the amplifier 10 is set to be large, the first PWM signal Vpwm1 is generated in a voltage range shown by ΔVth' in FIG. 5A. In such cases, a dynamic range of the temperature becomes smaller, but since it is possible to use a range in which the temperature detection voltage Vth changes linearly with respect to temperature, this is effective in cases in which it is desired to control the fan motor 110 linearly with respect to temperature.

Second Embodiment

In the first embodiment, a setting was made for cases in which the predetermined minimum frequency setting voltage Vmin is inputted to the minimum frequency setting terminal 104. In contrast to this, in a second embodiment, an explanation is given concerning technology for controlling the frequency of the fan motor 110 by actively changing voltage inputted to the minimum frequency setting terminal 104.

Figure 6:
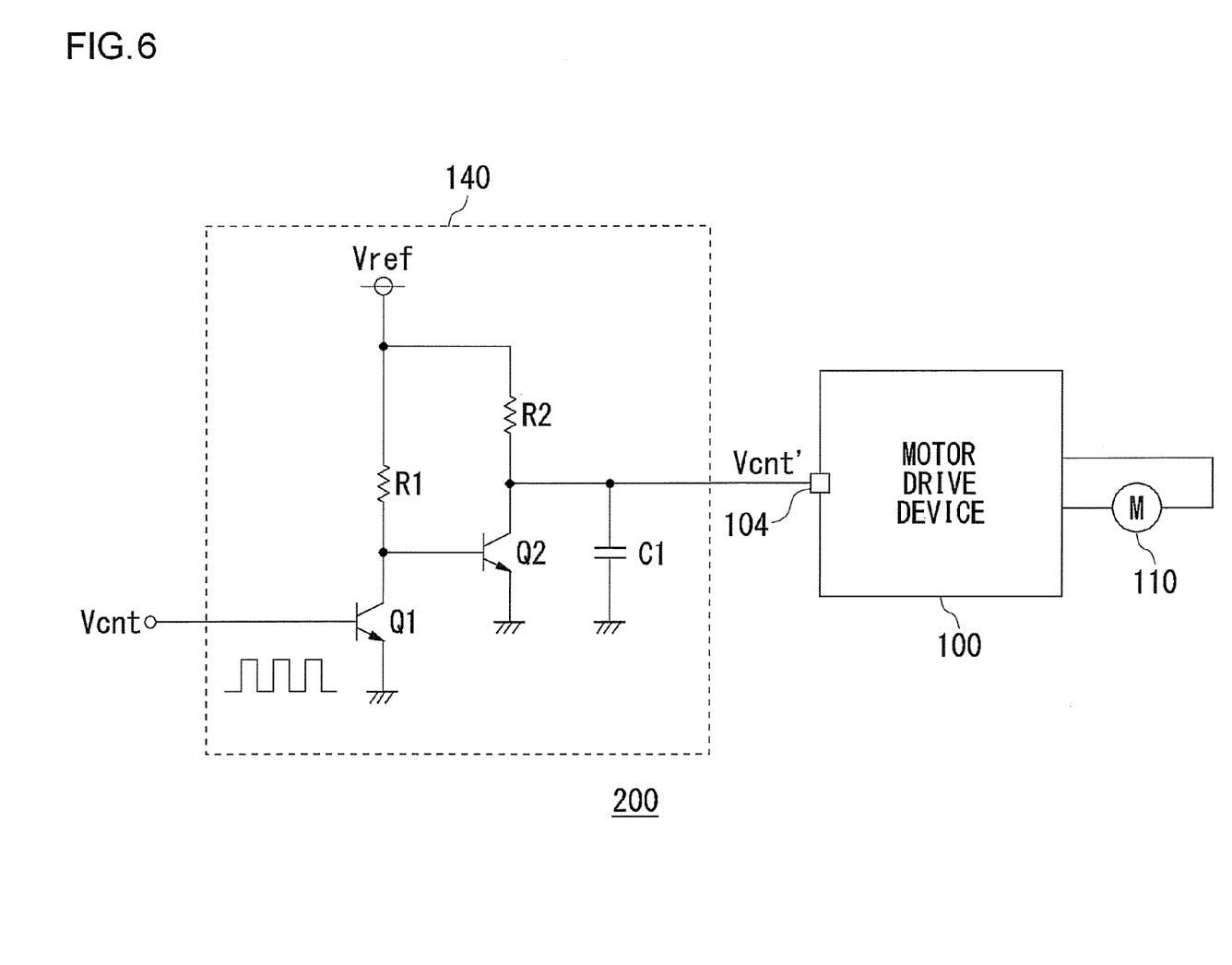
FIG. 6 is a circuit diagram showing a configuration of a cooling device according to a second embodiment.

FIG. 6 is a circuit diagram showing a configuration of a cooling device 200 according to the second embodiment. The cooling device 200 according to the present embodiment is further provided with a smoothing circuit 140 in addition to the cooling device 200 of FIG. 1. A pulse width modulated control signal Vcnt which controls the frequency of a fan motor 110 that is to be driven, is inputted to this cooling device 200, and the fan motor 110 is controlled based on this control signal Vcnt. In the present embodiment, a configuration of a motor drive apparatus 100 is similar to FIG. 1. The control signal Vcnt is outputted from a controller connected externally to the cooling device 200.

The smoothing circuit 140 smoothes the pulse width modulated control signal Vcnt which controls the frequency of the fan motor 110, and outputs the pulse width modulated control signal Vcnt as a direct current rotation control voltage Vcnt'. The smoothing circuit 140 may be configured using discrete parts external to the motor drive apparatus 100, or may be integrated inside the motor drive apparatus 100. The smoothing circuit 140 includes a first transistor Q1, a second transistor Q2, a capacitor C1, a first resistor R1, and a second resistor R2.

The control signal Vcnt is inputted to a base of the first transistor Q1, an emitter of which is grounded. One end of the first resistor R1 is connected to a collector of the first transistor Q1, and a predetermined voltage Vref is applied to the other end. A base of the second transistor Q2 is connected to a collector of the first transistor Q1, an emitter of which is grounded. One end of the second resistor R2 is connected to a collector of the second transistor Q2, and a predetermined voltage Vref is applied to the other end. The capacitor C1 is connected between a collector of the second transistor Q2 and ground. The smoothing circuit 140 outputs a signal that occurs at the collector of the second transistor Q2 as a direct current rotation control voltage Vcnt.

According to the cooling device 200 according to the present embodiment, it is possible to perform rotation control of the fan motor 110 according to a duty ratio of the control signal Vcnt inputted from outside. That is, a rotation control voltage Vcnt', whose voltage value becomes large as duty ratio of the control signal Vcnt becomes large, is outputted from the smoothing circuit 140 of FIG. 6. A second PWM comparator 24 compares the rotation control voltage Vcnt' with the cyclic voltage Vosc, and outputs the second PWM signal Vpwm2. As explained in the first embodiment, as the rotation control voltage Vcnt' becomes larger, the duty ratio of the second PWM signal Vpwm2 becomes smaller.

Figure 7:
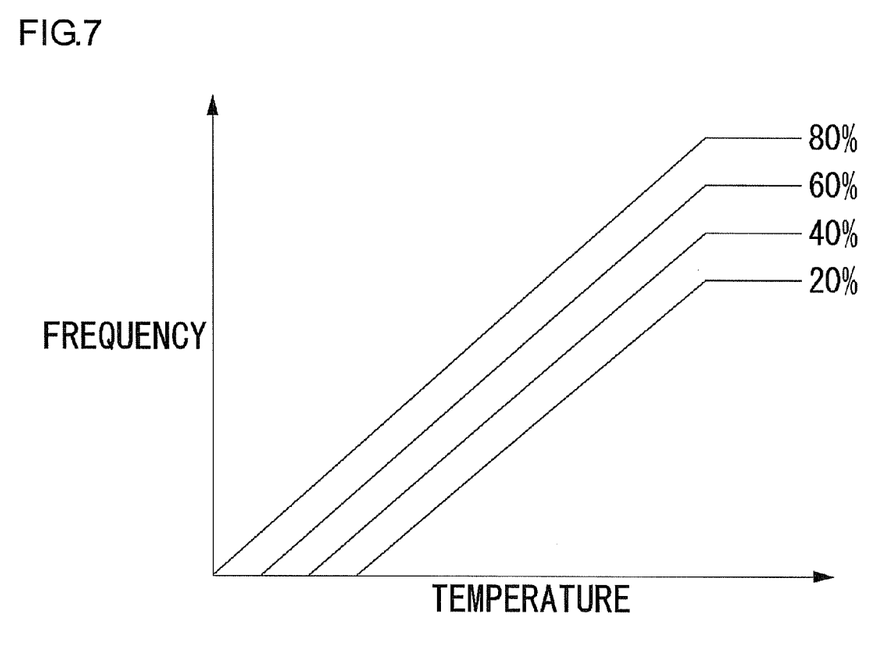
FIG. 7 shows a relationship of frequency of a fan motor when in a second drive mode, and temperature, in a cooling device according to the second embodiment.

FIG. 7 shows a relationship of frequency of the fan motor 110 when in a second drive mode, and temperature, in a cooling device 200 according to the second embodiment. As described above, in the second drive mode, the duty ratio of the second signal Sig2 has a value that is the duty ratio of the first PWM signal Vpwm1 less the duty ratio of the second PWM signal Vpwm2. Therefore, in cases in which the duty ratio of the control signal Vcnt is large, that is, the rotation control voltage Vcnt' is large, since the duty ratio of the second PWM signal Vpwm2 becomes small, the frequency of the fan motor 110 increases. As the duty ratio of the control signal Vcnt gradually becomes small, since the duty ratio of the second PWM signal Vpwm2 becomes large, and conversely the duty ratio of the second signal Sig2 becomes small, the frequency of the motor decreases.

According to the motor drive apparatus 100 according to the second embodiment described as above, it is possible to reflect both temperature and control voltage Vcnt in rotation control of the fan motor 110. Moreover, the rotation control voltage Vcnt' may be directly inputted from outside to the minimum frequency setting terminal 104 of the motor drive apparatus 100.

The abovementioned embodiments are examples, and a person skilled in the art will understand that various modified examples in combinations of various component elements and various processes thereof are possible, and that such modified examples are within the scope of the present invention.

In the embodiments, explanations have been given concerning cases in which the motor drive apparatus 100 is monolithically integrated on one LSI, but there is no limitation thereto, and part of the component elements may be arranged outside the LSI as discrete elements or as chip parts, or a configuration may be made of a plurality of LSIs. For example, the H-bridge circuit 36 of the drive circuit 30 may be configured using discrete power transistors.

Furthermore, with regard to the transistors used in the embodiments, bipolar transistors and FETs may be mutually substituted.

Settings of logical values at a high level and a low level, which were explained in the embodiments, are examples, and changes can be freely made by carrying out appropriate inversion by an inverter or the like. For example, the temperature detection circuit 130 may be configured with the resistor R10 and the thermistor Rth reversely connected. In such cases, the relationship of the temperature and the temperature detection voltage Vth is the opposite of the embodiments, but by performing logical inversion, it is possible to realize operation and effects similar to the embodiments.

While the preferred embodiments of the present invention have been described using specific terms, such description is for illustrative purposes only, and it is to be understood that changes and variations may be made without departing from the spirit or scope of the appended claims.

The invention claimed is:

1. A motor drive apparatus for use with a motor to be driven, the motor drive apparatus comprising:
    a first pulse width modulation comparator which compares a temperature detection voltage that depends on temperature, with a cyclic voltage, and outputs a first pulse with modulation signal;
    a second pulse width modulation comparator which compares a minimum frequency setting voltage indicating a minimum frequency of the motor that is to be driven, with the cyclic voltage, and outputs a second pulse width modulation signal; and
    a drive circuit which combines the first and the second pulse width modulation signals outputted from the first and the second pulse width modulation comparators, by a logical operation, to drive the motor that is to be driven, wherein the drive circuit comprises:
    a first logic gate which generates a logical sum of the first and the second pulse width modulation signals;
    a second logic gate which generates a logical product of one of the first and the second pulse width modulation signals, and an inverted signal of another of the first and the second pulse width modulation signals; and
    a selector which switches between a first drive mode based on an output signal of the first logic gate, and a second drive mode based on an output signal of the second logic gate.

2. The motor drive apparatus according to claim 1, further comprising:
    an amplifier which amplifies the temperature detection voltage; wherein
    the first pulse width modulation comparator generates a first pulse width modulation signal by comparing an output signal of the amplifier with the cyclic voltage.

3. The motor drive apparatus according to claim 2, wherein the amplifier is configured such that gain in the amplifier is adjustable by an external resistor.

4. The motor drive apparatus according to claim 1, further comprising:
    a smoothing circuit which smoothes a pulse width modulated control signal that controls frequency of the motor that is to be driven, and outputs the pulse width modulated control signal as a rotation control voltage; wherein
    the second pulse width modulation comparator compares the rotation control voltage instead of the minimum frequency setting voltage, with the cyclic voltage, and outputs the second pulse width modulation signal.

5. The motor drive apparatus according to claim 4, wherein the smoothing circuit comprises:
    a first transistor in which the control signal is inputted to a base and which has a grounded emitter;
    a first resistor, one end of which is connected to a collector of the first transistor, and a predetermined voltage being applied to the other end;
    a second transistor whose base is connected to a connection point of the first transistor and the first resistor and whose emitter is grounded;
    a second resistor, one end of which is connected to a collector of the second transistor, and the predetermined voltage being applied to another end; and
    a capacitor connected between the collector of the second transistor and ground; and wherein
    a signal occurring at the collector of the second transistor is outputted as the rotation control voltage.

6. The motor drive apparatus according to claim 1, wherein the motor drive apparatus is monolithically integrated on one semiconductor substrate.

7. A cooling device comprising:
    a fan motor; and
    a motor drive apparatus which drives the fan motor, the motor drive apparatus comprising:
    a first pulse width modulation comparator which compares a temperature detection voltage that depends on temperature, with a cyclic voltage, and outputs a first pulse width modulation signal;
    a second pulse width modulation comparator which compares a minimum frequency setting voltage indicating a minimum frequency of the fan motor, with the cyclic voltage, and outputs a second pulse width modulation signal; and a drive circuit which combines the first and the second pulse width modulation signals outputted from the first and the second pulse width modulation comparators, by a logical operation, to drive the fan motor, wherein the drive circuit comprises:

a first logic gate which generates a logical sum of the first and the second pulse width modulation signals;

a second logic gate which generates a logical product of one of the first and the second pulse width modulation signals, and an inverted signal of another of the first and the second pulse width modulation signals; and a selector which switches between a first drive mode based on an output signal of the first logic gate, and a second drive mode based on an output signal of the second logic gate.

8. A motor drive apparatus for use with a motor to be driven, the motor drive apparatus comprising:

a first pulse width modulation comparator which compares a temperature detection voltage that depends on temperature, with a cyclic voltage, and outputs a first pulse width modulation signal;

a second pulse width modulation comparator which compares a minimum frequency setting voltage indicating a minimum frequency of the motor that is to be driven, with the cyclic voltage, and outputs a second pulse width modulation signal; and a drive circuit which combines the first and the second pulse width modulation signals outputted from the first and the second pulse width modulation comparators, by a logical operation, to drive the motor that is to be driven;

a smoothing circuit which smoothes a pulse width modulated control signal that controls frequency of the motor that is to be driven, and outputs the pulse width modulated control signal as a rotation control voltage; wherein the second pulse width modulation comparator compares the rotation control voltage instead of the minimum frequency setting voltage, with the cyclic voltage, and outputs the second pulse width modulation signal.

9. The motor drive apparatus according to claim 8, wherein the smoothing circuit comprises:

a first transistor in which the control signal is inputted to a base and which has a grounded emitter;

a first resistor, one end of which is connected to a collector of the first transistor, and a predetermined voltage being applied to the other end;

a second transistor whose base is connected to a connection point of the first transistor and the first resistor and whose emitter is grounded;

a second resistor, one end of which is connected to a collector of the second transistor, and the predetermined voltage being applied to another end; and a capacitor connected between the collector of the second transistor and ground; and wherein a signal occurring at the collector of the second transistor is outputted as the rotation control voltage.

10. The motor drive apparatus according to claim 8, wherein the motor drive apparatus is monolithically integrated on one semiconductor substrate.

11. A cooling device comprising:

a fan motor; and a motor drive apparatus which drives the fan motor, the motor drive apparatus comprising:

a first pulse width modulation comparator which compares a temperature detection voltage that depends on temperature, with a cyclic voltage, and outputs a first pulse width modulation signal;

a second pulse width modulation comparator which compares a minimum frequency setting voltage indicating a minimum frequency of the fan motor, with the cyclic voltage, and outputs a second pulse width modulation signal; and a drive circuit which combines the first and the second pulse width modulation signals outputted from the first and the second pulse width modulation comparators, by a logical operation, to drive the fan motor;

a smoothing circuit which smoothes a pulse width modulated control signal that controls frequency of the fan motor, and outputs the pulse width modulated control signal as a rotation control voltage; wherein the second pulse width modulation comparator compares the rotation control voltage instead of the minimum frequency setting voltage, with the cyclic voltage, and outputs the second pulse width modulation signal.

* * * * *